(12) United States Patent
Lee et al.

(10) Patent No.: US 10,620,833 B2
(45) Date of Patent: Apr. 14, 2020

(54) MEMORY CONTROLLER AND CONTROL METHOD THEREOF

(71) Applicant: Samsung Electronics Co., Ltd., Suwon-si, Gyeonggi-do (KR)

(72) Inventors: Kyung-duk Lee, Seoul (KR); Young-seop Shim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/050,110

(22) Filed: Jul. 31, 2018

(65) Prior Publication Data

US 2019/0171360 A1 Jun. 6, 2019

(30) Foreign Application Priority Data

Dec. 1, 2017 (KR) .................. 10-2017-0164336

(51) Int. Cl.
| | |
|---|---|
| *G06F 16/26* | (2019.01) |
| *G06F 3/06* | (2006.01) |
| *G11C 16/26* | (2006.01) |
| *G11C 16/08* | (2006.01) |
| *G11C 16/10* | (2006.01) |
| *G11C 16/32* | (2006.01) |
| *G11C 7/04* | (2006.01) |
| *G11C 16/28* | (2006.01) |
| *G11C 16/34* | (2006.01) |

(52) U.S. Cl.
CPC .......... *G06F 3/0604* (2013.01); *G06F 3/0646* (2013.01); *G06F 3/0673* (2013.01); *G11C 7/04* (2013.01); *G11C 16/08* (2013.01); *G11C 16/10* (2013.01); *G11C 16/26* (2013.01); *G11C 16/28* (2013.01); *G11C 16/32* (2013.01); *G11C 16/3459* (2013.01)

(58) Field of Classification Search
CPC .................................................. G11C 11/5628
USPC .................................................. 365/189.011
See application file for complete search history.

(56) References Cited

U.S. PATENT DOCUMENTS

| | | | |
|---|---|---|---|
| 6,148,360 A | 11/2000 | Leak et al. | |
| 6,930,925 B2 | 8/2005 | Guo et al. | |
| 7,821,837 B2 | 10/2010 | Chun et al. | |
| 8,614,919 B2 * | 12/2013 | Lee ..................... | G11C 11/5628 365/185.18 |
| 9,189,434 B2 | 11/2015 | Kim | |
| 9,244,835 B2 | 1/2016 | Yoo | |

(Continued)

FOREIGN PATENT DOCUMENTS

KR    1020000004733    1/2000

OTHER PUBLICATIONS

US 9,496,011 B2, 11/2016, Hong et al. (withdrawn)

*Primary Examiner* — Min Huang
(74) *Attorney, Agent, or Firm* — Myers Bigel, P.A.

(57) ABSTRACT

A read control method of a memory controller for controlling a memory device including a plurality of memory pages respectively connected to a plurality of word lines includes identifying a selected memory page connected to a selected word line among the plurality of memory pages has undergone a suspend operation, determining a read offset level of the selected memory page based on suspend operation information associated with the selected memory page according to a result of the identifying the selected memory page, and controlling a read operation of the memory device based on a read voltage associated with the read offset level that was determined.

19 Claims, 19 Drawing Sheets

(56) References Cited

U.S. PATENT DOCUMENTS

| | | |
|---|---|---|
| 9,293,206 B2 | 3/2016 | Nam |
| 9,564,228 B2 | 2/2017 | Tokiwa |
| 2014/0047167 A1 | 2/2014 | Kwak et al. |
| 2015/0117113 A1* | 4/2015 | Li .......................... G11C 16/10 365/185.19 |
| 2015/0186042 A1* | 7/2015 | Lee ....................... G11C 16/32 711/103 |
| 2016/0313946 A1 | 10/2016 | Zang et al. |

\* cited by examiner

FIG. 7A

| ADDR | PSR_FLAG | tRES |
|---|---|---|
| ADDR_1 | '1' | tRES_1 |
| ADDR_2 | '1' | tRES_2 |
| ADDR_3 | '0' | — |
| ⋮ | ⋮ | ⋮ |
| ADDR_k | '1' | tRES_$l$ |

PSR INFORMATION
(PSR_INFO)

FIG. 7B

PSR INFORMATION
(PSR_INFO)

| ADDR | PSR_FLAG | N_PSR | tRES_ACC | SECTION | TEMPERATURE |
|---|---|---|---|---|---|
| ADDR_1 | '1' | N_1 | tRES_ACC_1 | SEC_1 | TEMP_1 |
| ADDR_2 | '1' | N_2 | tRES_ACC_2 | SEC_2 | TEMP_2 |
| ADDR_3 | '0' | - | - | - | - |
| ... | ... | ... | ... | ... | ... |
| ADDR_m | '1' | N_l | tRES_ACC_l | SEC_l | TEMP_l |

| tRES | READ OFFSET LEVEL (ROL) |
|---|---|
| 0~tREF_1 | ROL_1 |
| tREF_1~tREF_2 | ROL_2 |
| tREF_2~tREF_3 | ROL_3 |
| ⋮ | ⋮ |
| tREF_k-1~tREF_k | ROL_k |
| tREF_k~ | READ RECLAIM |

OFFSET LEVEL INFORMATION (OL_INFO)

FIG. 13

| OFFSET LEVEL INFORMATION (OL_INFO) ||
|---|---|
| N_PSR | READ OFFSET LEVEL (ROL) |
| 0~NREF_1 | ROL_1 |
| NREF_1~NREF_2 | ROL_2 |
| NREF_2~NREF_3 | ROL_3 |
| ⋮ | ⋮ |
| NREF_m-1~NREF_m | ROL_m |
| NREF_m~ | READ RECLAIM |

FIG. 14

| OFFSET LEVEL INFORMATION (OL_INFO) ||
|---|---|
| tRES_ACC | READ OFFSET LEVEL (ROL) |
| 0~tREF_1 | ROL_1 |
| tREF_1~tREF_2 | ROL_2 |
| tREF_2~tREF_3 | ROL_3 |
| ⋮ | ⋮ |
| tREF_m-1~tREF_m | ROL_m |
| tREF_m~ | READ RECLAIM |

FIG. 15A

| OFFSET LEVEL INFORMATION (OL_INFO) ||
|---|---|
| TEMPERATURE | READ OFFSET LEVEL (ROL) |
| 0~TEMP_REF_1 | ROL_1 |
| TEMP_REF_1~TEMP_REF_2 | ROL_2 |
| TEMP_REF_2~TEMP_REF_3 | ROL_3 |
| ⋮ | ⋮ |
| TEMP_REF_m−1~TEMP_REF_m | ROL_m |

FIG. 15B

| OFFSET LEVEL INFORMATION (OL_INFO) |||
|---|---|---|
| TEMPERATURE | tRES | READ OFFSET LEVEL (ROL) |
| 0 ~ TEMP_REF_1 | 0~tREF_1 | ROL_1 |
| | tREF_1~tREF_2 | ROL_2 |
| | ⋮ | ⋮ |
| | tREF_k-1~tREF_k | ROL_k |
| | tREF_k~ | READ RECLAIM |

⋮

| TEMPERATURE | tRES | READ OFFSET LEVEL (ROL) |
|---|---|---|
| TEMP_REF_m-1 ~ TEMP_REF_m | 0~tREF_1' | ROL_1' |
| | tREF_1'~tREF_2' | ROL_2' |
| | ⋮ | ⋮ |
| | tREF_k-1'~tREF_k' | ROL_k' |
| | tREF_k'~ | READ RECLAIM |

FIG. 17

| \multicolumn{3}{c}{OFFSET LEVEL INFORMATION (OL_INFO)} |

| PAGE TYPE | tRES | READ OFFSET LEVEL (ROL) |
|---|---|---|
| LSB | 0~tREF_1 | ROL_1 |
|  | tREF_1~tREF_2 | ROL_2 |
|  | ⋮ | ⋮ |
|  | tREF_k-1~tREF_k | ROL_k |
|  | tREF_k~ | READ RECLAIM |

| PAGE TYPE | tRES | READ OFFSET LEVEL (ROL) |
|---|---|---|
| CSB | 0~tREF_1' | ROL_1' |
|  | tREF_1'~tREF_2' | ROL_2' |
|  | ⋮ | ⋮ |
|  | tREF_k-1'~tREF_k' | ROL_k' |
|  | tREF_k'~ | READ RECLAIM |

| PAGE TYPE | tRES | READ OFFSET LEVEL (ROL) |
|---|---|---|
| MSB | 0~tREF_1" | ROL_1" |
|  | tREF_1"~tREF_2" | ROL_2" |
|  | ⋮ | ⋮ |
|  | tREF_k-1"~tREF_k" | ROL_k" |
|  | tREF_k"~ | READ RECLAIM |

FIG. 18

| OFFSET LEVEL INFORMATION (OL_INFO) |||
| --- | --- | --- |
| # OF P/E CYCLEs | tRES | READ OFFSET LEVEL (ROL) |
| 0 ~ NREF_1 | 0~tREF_1 | ROL_1 |
| | tREF_1~tREF_2 | ROL_2 |
| | ⋮ | ⋮ |
| | tREF_k-1~tREF_k | ROL_k |
| | tREF_k~ | READ RECLAIM |
| ⋮ |||
| # OF P/E CYCLEs | tRES | READ OFFSET LEVEL (ROL) |
| NREF_m-1 ~ NREF_m | 0~tREF_1' | ROL_1' |
| | tREF_1'~tREF_2' | ROL_2' |
| | ⋮ | ⋮ |
| | tREF_k-1'~tREF_k' | ROL_k' |
| | tREF_k'~ | READ RECLAIM |

MEMORY CONTROLLER AND CONTROL METHOD THEREOF

CROSS-REFERENCE TO RELATED APPLICATION

This U.S. non-provisional patent application claims priority under 35 U.S.C. § 119 to Korean Patent Application No. 10-2017-0164336, filed on Dec. 1, 2017, in the Korean Intellectual Property Office, the disclosure of which is incorporated herein in its entirety by reference.

BACKGROUND

The inventive concept relates to a memory controller, and more particularly, to a control method of a memory controller.

Semiconductor memory devices may be classified into volatile memory devices, which lose stored data when power is not supplied thereto, and non-volatile memory devices, which do not lose stored data when power is not supplied thereto. The volatile memory devices have high read and write speeds, but when external power is not supplied thereto, content stored therein disappears. On the contrary, the non-volatile memory devices have lower read and write speeds than the volatile memory devices, but even when external power is not supplied thereto, content stored therein is maintained.

For example, in a non-volatile memory device such as a flash memory device, as the number of bits of data stored in one memory cell increases, a threshold voltage distribution of memory cells included in the memory device may need to be formed more elaborately. A read error may occur when the threshold voltage distribution is formed more widely than a predicted threshold voltage distribution or formed at a location after parallel translation. Methods of performing a highly reliable data read operation when a threshold voltage distribution of memory cells is changed may be needed.

SUMMARY

The inventive concept provides, in a memory controller and a control method of the same, a method and device for improving the reliability of a read operation on a memory page which has undergone a suspend operation during a program operation.

According to some embodiments of the inventive concept, there is provided a read control method of a memory controller for controlling a memory device including a plurality of memory pages respectively connected to a plurality of word lines, including identifying a selected memory page connected to a selected word line among the plurality of word lines that has undergone a suspend operation, determining a read offset level of the selected memory page based on suspend operation information associated with the selected memory page according to a result of the identifying the selected memory page, and controlling a read operation of the memory device based on a read voltage associated with the read offset level that was determined.

According to some embodiments of the inventive concept, there is provided a program control method of a memory controller for controlling a memory device including a plurality of memory pages respectively connected to a plurality of word lines, including receiving a request for a data operation with a higher priority from an external host during a program operation on a selected memory page of the plurality of memory pages connected to a selected word line of the plurality of word lines of the memory device, and transmitting a suspend command to the memory device, responsive to the receiving the request for the data operation with the higher priority, receiving, from the memory device, a signal indicating that the program operation has been suspended, responsive to the transmitting the suspend command, and transmitting, to the memory device, a command corresponding to the request for the data operation with the higher priority, transmitting a resume command to the memory device such that the memory device resumes the program operation after completion of the data operation with the higher priority, and storing suspend flag information indicating that the selected memory page has undergone a suspend operation and suspend operation information of the selected memory page.

According to some embodiments of the inventive concept, there is provided a memory controller for controlling a memory device including a plurality of memory pages respectively connected to a plurality of word lines, including a processor, and an internal memory configured to store suspend flag information, which indicates whether a suspend operation has been performed, and suspend operation information for each memory page of the plurality of memory pages, and to store matching information of a read offset level corresponding to the suspend operation information. The processor is configured to control the memory controller to transmit a read command signal to the memory device based on the suspend operation information and the read offset level of a selected memory page connected to a selected word line of the plurality of word lines, responsive to identifying that the selected memory page has undergone a suspend operation based on the suspend flag information of the selected memory page, and responsive to a read request received from an external host for the memory controller. The suspend information and the offset level information are stored in the internal memory.

BRIEF DESCRIPTION OF THE DRAWINGS

Embodiments of the inventive concept will be more clearly understood from the following detailed description taken in conjunction with the accompanying drawings in which:

FIGS. 7A and 7B show tables illustrating suspend information according to example embodiments of the present inventive concept.

FIG. 13 shows a table illustrating offset level information according to example embodiments of the present inventive concept.

FIG. 14 shows a table illustrating offset level information according to example embodiments of the present inventive concept.

FIGS. 15A and 15B show tables illustrating offset level information according to example embodiments of the present inventive concept.

FIG. 17 shows tables illustrating offset level information according to example embodiments of the present inventive concept.

FIG. 18 shows tables illustrating offset level information according to example embodiments of the present inventive concept.

DETAILED DESCRIPTION OF THE EMBODIMENTS

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

Hereinafter, embodiments of the inventive concept will be described in detail with reference to the accompanying drawings.

Figure 1:
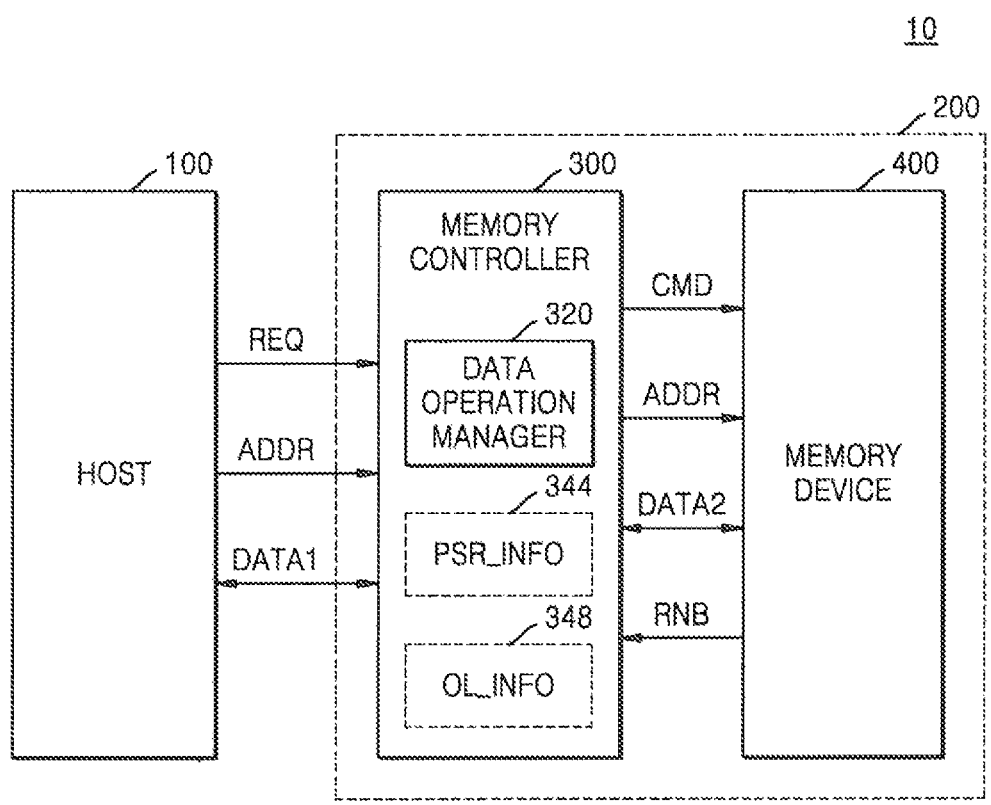
FIG. 1 is a block diagram of a system according to example embodiments of the present inventive concept.

FIG. 1 is a block diagram of a system 10 according to an some embodiments of the inventive concept. The system 10 may include a host 100 and a memory system 200, and the memory system 200 may include a memory controller 300 and a memory device 400. The system 10 may be provided as one of various computing systems such as an ultra mobile personal computer (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, and/or a digital camera.

Each of the host 100, the memory controller 300, and the memory device 400 may be provided as a single chip, a single package, a single module, or the like but is not limited thereto. For example, the memory controller 300 may be provided as an application processor together with the host 100. In some embodiments, the memory controller 300 may be provided as the memory system 200 together with the memory device 400.

The host 100 may transmit a data operation request REQ and an address ADDR to the memory controller 300 and transmit and/or receive data DATA1 to and/or from the memory controller 300. For example, the host 100 may exchange data with the memory controller 300 based on at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a mobile industry processor interface (MIPI) protocol, and/or a universal flash storage (UFS) protocol.

The memory controller 300 may control the memory device 400 in response to a request from the host 100. For example, the memory controller 300 may control the memory device 400 to read data DATA2 stored in the memory device 400 in response to a data operation request REQ of the host 100 or to write data DATA2 in the memory device 400. The memory controller 300 may perform write, read, and erase operations on the memory device 400 by providing an address ADDR, a command CMD, and a control signal to the memory device 400. The write operation may be called a program operation. In addition, data DATA2 for the operations may be transmitted and/or received between the memory controller 300 and the memory device 400. The memory controller 300 may receive a ready and busy signal RNB from the memory device 400. The ready and busy signal RNB may be a signal indicating whether the memory device 400 is operating.

The memory controller 300 may include a data operation manager 320 and internal memory 340 that may store suspend information PSR_INFO 344 and offset level information OL_INFO 348. The data operation manager 320 may generally control a data operation of the memory device 400. For example, when the memory controller 300 receives a data operation request REQ with a higher priority from the host 100 while the memory device 400 is performing a program operation on a selected memory page connected to a selected word line, the data operation manager 320 may transmit a suspend command signal to the memory device 400 such that the program operation which the memory device 400 is performing is suspended. Thereafter, the data operation manager 320 may transmit a resume command signal to the memory device 400 such that the memory device 400 resumes the suspended program operation. As described above, suspending, by the memory device 400, a program operation currently being performed in order to perform a data operation with a higher priority, and then resuming the program operation may be referred to performing a suspend operation. The performing of a suspend operation by the memory device 400 may be referred to as an experience of a suspend operation of the memory device 400. When a suspend operation is performed on a selected memory page of the memory device 400, the data operation manager 320 may store suspend flag information indicating that the selected memory page has undergone a suspend operation, in the memory controller 300, as a part of the suspend information PSR_INFO 344. Also, when the suspend operation is performed on the selected memory page of the memory device 400, the data operation manager 320 may store suspend operation information including at least one of various pieces of information regarding an operation variable of the suspend operation on the selected memory page, a resume time, an entry time point, an accumulated number of times, and the like, in the memory controller 300, as a part of the suspend information PSR_INFO 344. The suspend information PSR_INFO 344 may be stored in an internal memory of the memory controller 300 but is not limited thereto. Unlike as shown in FIG. 1, the suspend information PSR_INFO 344 may be stored in another memory inside the memory system 200 including in the memory controller 300 or the memory.

The data operation manager 320 may identify whether a selected memory page has undergone a suspend operation, based on the suspend flag information included in the suspend information PSR_INFO 344, when a data read request REQ is received from the host 100. When the selected memory page has undergone a suspend operation, the data operation manager 320 may determine a read offset level indicating an offset level of a read voltage based on the suspend operation information of the selected memory page. The suspend operation information may be included in the suspend information PSR_INFO 344, and/or in the offset level information OL_INFO 348. The offset level information OL_INFO 348 may include matching information of the read offset level corresponding to the suspend operation information. The data operation manager 320 may control a read operation of the memory device 400 based on the determined read offset level. For example, the data operation manager 320 may determine the read offset level by comparing the offset level information OL_INFO 348 including the matching information of the read offset level corresponding to a resume time indicating a time interval of a program suspend section by a suspend operation and a resume time of the selected memory page, and control a read operation of the memory device 400 based on the determined read offset level. A detailed operation of the data operation manager 320 may be described in more detail with reference to the drawings such as, for example FIG. 5.

The data operation manager 320 may be implemented by hardware including a circuit configured to manage a data operation, and/or implemented by software including a plurality of programs and stored in the memory controller 300 or by a combination of hardware and software. When the data operation manager 320 is implemented by software, the data operation manager 320 may be implemented as a part of a function of a Flash Translation Layer (FTL) and executed by a processor, but is not limited thereto. For example, the data operation manager 320 may be implemented by a combination of hardware and software.

The memory device 400 may include at least one memory cell array. The memory cell array may include a plurality of memory cells arranged in regions in which a plurality of word lines and a plurality of bit lines cross, and the plurality of memory cells may be non-volatile memory cells. Each memory cell may be a multi-level cell (MLC) configured to store two or more bits of data. For example, each memory cell may be a 2-bit MLC configured to store 2-bit data, a triple level cell (TLC) configured to store 3-bit data, a quadruple level cell (QLC) configured to store 4-bit data, or an MLC configured to store more-bit data. However, the present embodiment is not limited thereto, and for example, some memory cells may be single level cells (SLCs) configured to store 1-bit data, and some other memory cells may be MLCs. The memory device 400 may include a NAND flash memory, a vertical NAND (VNAND) flash memory, a NOR flash memory, resistive random access memory (RRAM), phase-change memory (PRAM), magnetoresistive random access memory (MRAM), ferrelectric random access memory (FRAM), spin transfer torque random access memory (STT-RAM), and the like, taken alone or in combination. The memory device 400 may transmit a ready and busy signal RNB to the memory controller 300. The ready and busy signal RNB may be a signal indicating whether the memory device 400 is operating. For example, when the memory device 400 is performing a program operation, the ready and busy signal RNB may indicate a busy state (for example, logic low). In this case, for convenience of description, it is described that the ready and busy signal RNB indicates "B". When the memory device 400 is not performing a data operation, the ready and busy signal RNB may indicate a ready state (for example, logic high). In this case, for convenience of description, it is described that the ready and busy signal RNB indicates "R".

According to an exemplary embodiment of the inventive concept, in a read operation on a selected memory page which has undergone a suspend operation, the memory controller 300 may control a read operation of the memory device 400 by determining a read offset level based on suspend operation information, thereby improving the reliability of the read operation on the selected memory page and the performance of the memory device 400.

Figure 2:
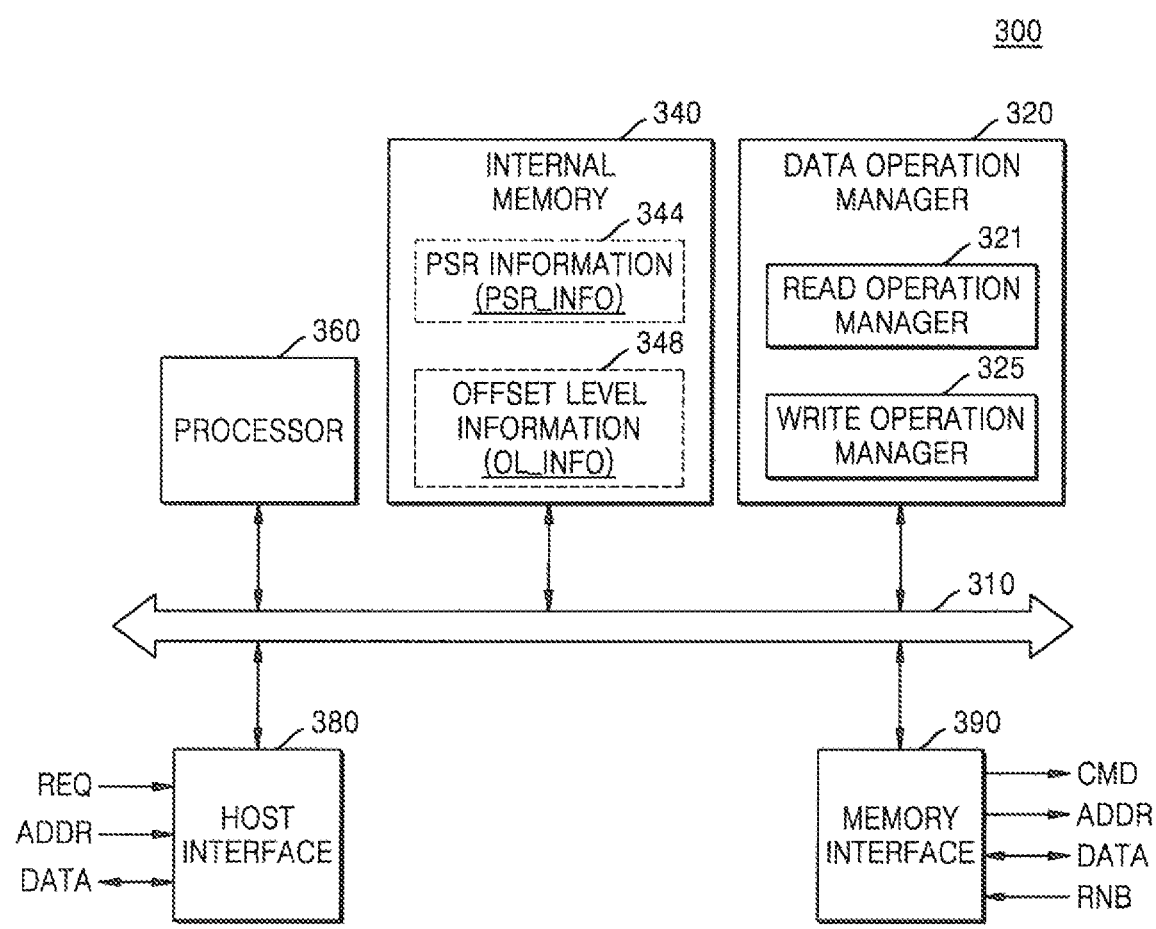
FIG. 2 is a block diagram of a memory controller according to example embodiments of the present inventive concept.

FIG. 2 is a block diagram of the memory controller 300 according to an exemplary embodiment of the inventive concept. The memory controller 300 may include a bus 310, the data operation manager 320, an internal memory 340, a processor 360, a host interface 380, and a memory interface 390. Besides these components, the memory controller 300 may further include various components, for example, a command generation module configured to generate a command CMD for controlling a memory operation, and the like. The same description of the memory controller 300 provided with reference to FIG. 1 will be omitted.

The bus 310 may provide a channel between components inside the memory controller 300. The bus 310 may operate based on one of various bus protocols.

The data operation manager 320 may include a read operation manager 321 and a write operation manager 325. The read operation manager 321 may control a read operation of a memory device, and the write operation manager 325 may control a write operation of the memory device. The read operation manager 321 may identify whether a selected memory page has undergone a suspend operation, based on suspend flag information included in suspend information PSR_INFO 344 in internal memory 340. In response to the suspend operation which the selected memory page has undergone, the read operation manager 321 may determine a read offset level based on offset level information OL_INFO 348 stored in internal memory 340 and/or the suspend flag information included in the suspend information PSR_INFO 344. The memory controller 300 may control a read operation of the memory device based on the determined read offset level. The write operation manager 325 may perform a control operation to suspend a program operation being performed in the memory device, when a data operation request with a higher priority is received while the memory device is performing the program operation. After the data operation with a higher priority is completed, the write operation manager 325 may perform a control operation such that the memory device resumes the suspended program operation. When the memory device performs the suspend operation described above, the write operation manager 325 may store suspend flag information, which indicates that a memory page has undergone a suspend operation, and suspend operation information as the suspend information PSR_INFO 344 in the internal memory 340. For example, a timer of the write operation manager 325 may count an internal clock or an external clock of the memory controller 300 to measure a resume time indicating a time interval of a program suspend section by a suspend operation and to store the resume time as a part of the suspend information PSR_INFO 344. The data operation manager 320 will be described in more detail with reference to FIG. 5.

The internal memory 340 may store various types of information needed to operate the memory controller 300. To this end, the internal memory 340 may be implemented by various kinds of memories, for example, at least one of cache memory, dynamic RAM (DRAM), static RAM (SRAM), PRAM, and flash memory devices. The internal memory 340 may store the suspend information PSR_INFO 344 and offset level information OL_INFO 348. The suspend information PSR_INFO 344 may include suspend flag information indicating that each memory page of the memory device has undergone a suspend operation and suspend operation information including at least one of various pieces of information regarding the suspend operation. The suspend information PSR_INFO 344 will be described in more detail with reference to FIGS. 7A and 7B. The offset level information OL_INFO 348 may include matching information of a read offset level corresponding to the suspend operation information. The offset level information OL_INFO 348 will be described in more detail with reference to FIGS. 9 and 12A to 18.

The processor 360 may control a general operation of the memory controller 300. The processor 360 may include a central processing unit (CPU) or a micro-processing unit (MCU). The processor 360 may execute firmware to control the memory controller 300, and the firmware may be executed by being loaded on the internal memory 340.

The host interface 380 may provide an interface between a host and the memory controller 300. The host and the memory controller 300 may transmit and receive data through one of various standard interfaces. Alternatively, the host and the memory controller 300 may transmit and receive data through a plurality of interfaces among the various standard interfaces. The memory controller 300 may receive a data operation request REQ and an address ADDR from the host and transmit and receive data to and from the host through the host interface 380.

The memory interface 390 may provide an interface between the memory device and the memory controller 300. For example, data DATA processed by the processor 360 may be stored in the memory device through the memory interface 390. As another example, data DATA stored in the memory device may be provided to the processor 360 through the memory interface 390. Through the memory interface 390, the memory controller 300 may transmit a command CMD, an address ADDR, and the like to the memory device, receive a ready and busy signal RNB from the memory device, and transmit and/or receive data DATA to and/or from the memory device.

According to an exemplary embodiment of the inventive concept, the memory controller 300 may control a read operation of the memory device 400 by determining a read offset level based on suspend operation information in a read operation on a selected memory page which has undergone a suspend operation, thereby improving the reliability of the read operation on the memory page and the performance of the memory device 400.

Figure 3:
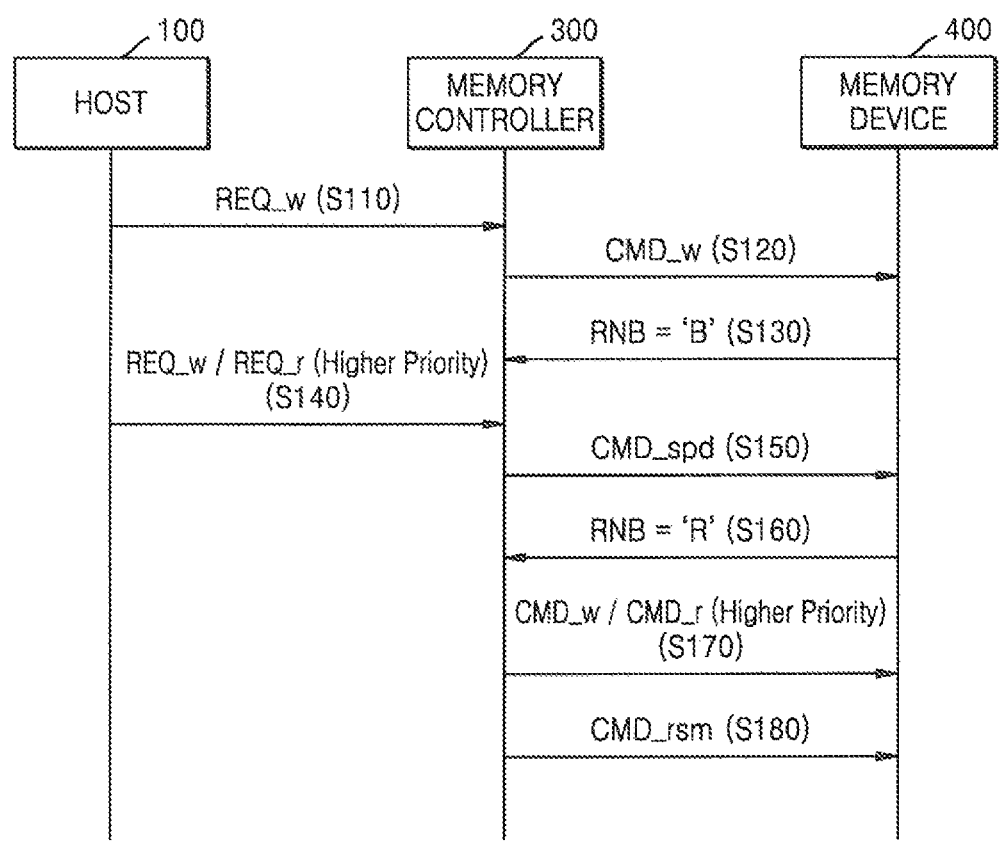
FIG. 3 is a signaling diagram of a program operation and a suspend operation according to example embodiments of the present inventive concept.

FIG. 3 is a signaling diagram of a program operation and a suspend operation according to an exemplary embodiment of the inventive concept. Description of the memory controller 300 and the memory device 400 provided with reference to FIGS. 1 and 2 will be omitted here for brevity.

In operation SI 10, the host 100 may transmit a write request REQ_w to the memory controller 300. Hereinafter, "write operation" and "program operation" indicate the same operation.

In operation S120, the memory controller 300 may transmit a write command CMD_w to the memory device 400 in response to the reception of the write request REQ_w. The memory device 400 may perform a program operation in response to the reception of the write command CMD_w.

While the memory device 400 is performing the program operation, the memory device 400 may transmit a ready and busy signal RNB as "B" indicating a busy state to the memory controller 300 in operation S130 to inform the memory controller 300 that the memory device 400 is performing the program operation. As a non-limiting example, the memory device 400 may transmit the ready and busy signal RNB as logic low to the memory controller 300.

While the memory device 400 is performing the program operation, the host 100 may transmit a data write or read request REQ_w/REQ_r with a higher priority to the memory controller 300 in operation S140.

In response to the reception of the data write or read request REQ_w/REQ_r with a higher priority, the memory controller 300 may transmit a suspend command CMD_spd to the memory device 400 in operation S150. The memory device 400 may suspend the program operation being performed, in response to the reception of the suspend command CMD_spd.

After suspending the program operation, the memory device 400 may transmit a ready and busy signal RNB as "R" indicating a ready state to the memory controller 300 in operation S160 to inform the memory controller 300 that the program operation has been suspended. As a non-limiting example, the memory device 400 may transmit the ready and busy signal RNB as logic high to the memory controller 300.

In operation S170, the memory controller 300 may transmit a read or write command CMD_w/CMD_r corresponding to the data write or read request REQ_w/REQ_r with a higher priority to the memory device 400 in response to the reception of the ready and busy signal RNB. The memory device 400 may perform a data write or read operation with a higher priority.

After the memory device 400 finishes the data write or read operation with a higher priority, the memory controller 300 may transmit a resume command CMD_rsm to the memory device 400 in operation S180. The memory device 400 may resume the suspended program operation in response to the reception of the resume command CMD_rsm.

As described above with reference to FIG. 3, a series of operations in which the memory device 400 suspends a program operation being performed, in response to a data write or read request REQ_w/REQ_r with a higher priority from the host 100 while performing the program operation, and then resumes the suspended program operation, may be called a program suspend resume operation. The program suspend resume operation is called a resume operation for convenience of description.

Figure 4:
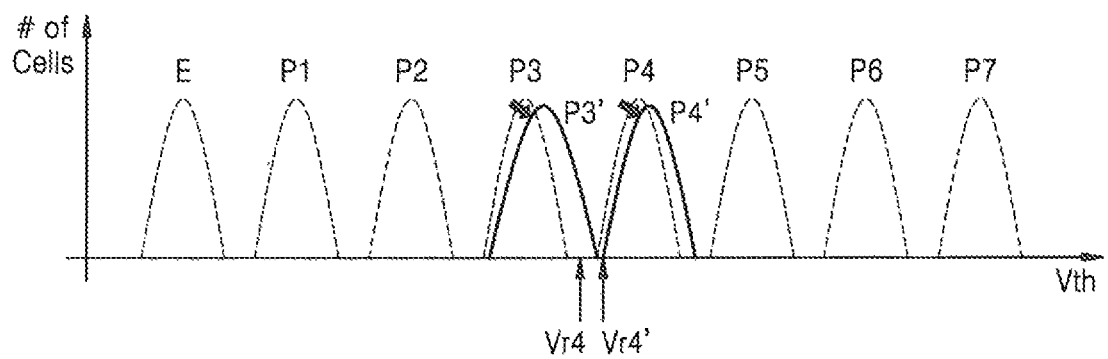
FIG. 4 is a graph illustrating a threshold voltage distribution of memory cells, according to example embodiments of the present inventive concept.

FIG. 4 is a graph illustrating a threshold voltage distribution of memory cells, according to an exemplary embodiment of the inventive concept. Particularly, FIG. 4 shows a distribution when a memory cell is a triple level cell (TLC) that is a 3-bit MLC, but the threshold voltage distribution of memory cells is not limited thereto.

Referring to FIG. 4, the horizontal axis indicates a threshold voltage Vth, and the vertical axis indicates the number of memory cells. When a memory cell is a TLC to be programmed in three bits, the memory cell may have one state among an erase state E and first to seventh program states P1 to P7. More electrons may be injected to a floating gate of the memory cell toward the seventh program state P7 from the erase state E. A fourth read voltage Vr4 may have a voltage level between threshold voltage distributions of memory cells having the third program state P3 and the fourth program state P4.

A case where a selected memory page among a plurality of memory pages included in a memory device has undergone a suspend operation will now be described. The suspend operation includes a process of suspending a program operation being performed and resuming the suspended program operation, and in the process, a threshold voltage distribution of memory cells included in the selected memory page may be formed differently from an ideal threshold voltage distribution. For example, a distribution in which the third program state P3 is changed to a changed third program state P3' and the fourth program state P4 is changed to a changed fourth program state P4' may be formed. Although it is shown for convenience of description that a distribution of the third program state P3 and the fourth program state P4 is changed, a distribution of the other program states may be changed by a suspend operation. In addition, although it is shown that a threshold voltage distribution of the third program state P3 and the fourth program state P4 is shifted to the right on the graph by a suspend operation (i.e. vth increases), the present embodiment is not limited thereto. For example, a threshold voltage distribution of the third program state P3 and/or the fourth program state P4 may be shifted to the left on the graph by a suspend operation (i.e. vth decreases), according to some embodiments.

When the memory cells have the threshold voltage distribution of the changed third program state P3' and the changed fourth program state P4' according to a suspend operation, if the fourth read voltage Vr4 is applied to a word line to perform a read operation, a read error may occur. Therefore, in this case, a changed fourth read voltage Vr4' may be applied to the word line instead of the fourth read voltage Vr4 for a highly reliable read operation.

A shift degree of threshold voltage distribution of a program state may vary according to an influence of variables such as a resume time indicating a time interval of a program suspend section according to a suspension, an entry time point for an incremental step pulse program (ISPP) operation, the number of suspend operations, and a temperature. ISPP is an iterative programming mechanism that increases the voltage level of a flash cell step by step. After each step, the voltage level may be compared to a desired voltage threshold in order to achieve balance between voltage threshold distribution and programming time. In some embodiments, a memory controller may store at least one of the variables as suspend operation information when a suspend operation is performed on a selected memory page, and change a read voltage by determining a read offset level based on the stored suspend operation information in a read operation. For example, referring to FIG. 4, the read offset level may be a value obtained by subtracting the fourth read voltage Vr4 from the changed fourth read voltage Vr4'.

According to some embodiments of the inventive concept, when a memory controller controls a read operation of a memory device, if a selected memory page has undergone a suspend operation, a read voltage may be corrected based on suspend operation information to increase the reliability of the read operation of the memory device.

Figure 5:
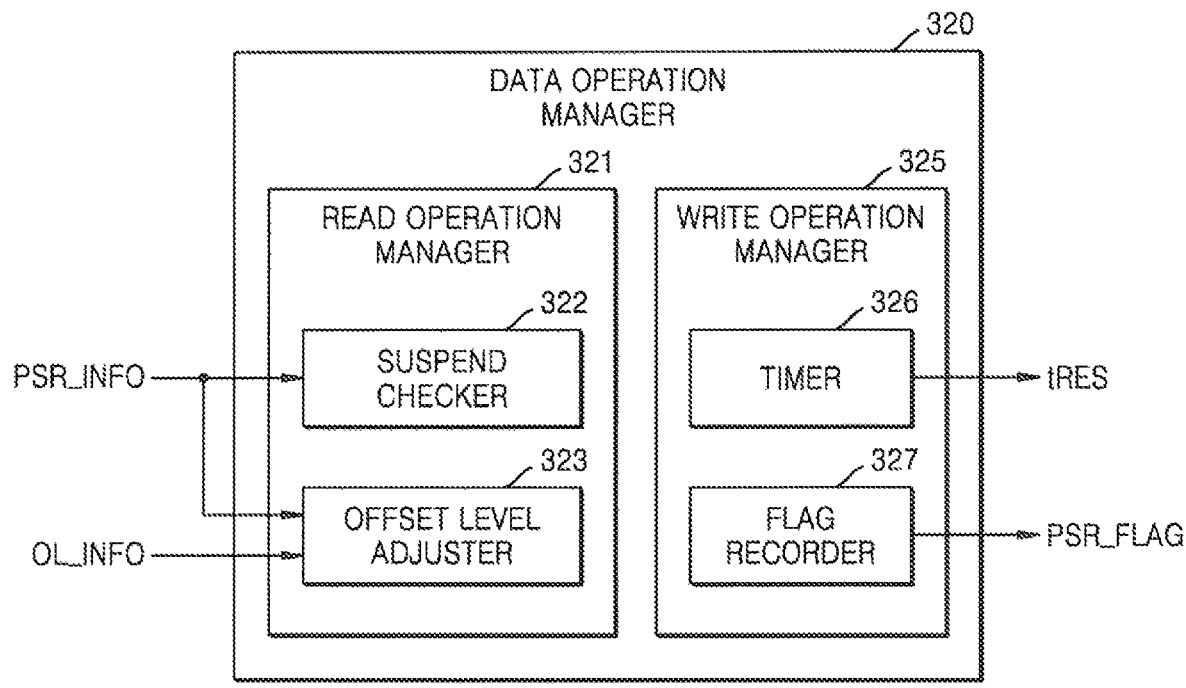
FIG. 5 is a block diagram of a data operation manager according to example embodiments of the present inventive concept.

FIG. 5 is a block diagram of the data operation manager 320 according to some embodiments of the inventive concept. The data operation manager 320 may include the read operation manager 321 and the write operation manager 325. Description of the read operation manager 321 and the write operation manager 325 provided with reference to FIG. 2 is omitted here for brevity.

The read operation manager 321 may include a suspend checker 322 and an offset level adjuster 323.

The suspend checker 322 may receive stored suspend information PSR_INFO. The suspend checker 322 may identify whether a selected memory page to be read has undergone a suspend operation, based on the received suspend information PSR_INFO. For example, the suspend checker 322 may identify whether the selected memory page has undergone a suspend operation, based on suspend flag information included in the received suspend information PSR_INFO.

The offset level adjuster 323 may receive stored suspend information PSR_INFO and offset level information OL_INFO. The offset level adjuster 323 may determine a read offset level, which may be a value for correcting a read voltage, when a selected memory page has undergone a suspend operation. For example, the offset level adjuster 323 may determine the read offset level based on suspend operation information, which is included in the received stored suspend information PSR_INFO, and the received offset level information OL_INFO. The offset level information OL_INFO may include matching information of the read offset level corresponding to the suspend operation information, and the offset level adjuster 323 may determine the read offset level by comparing the suspend operation information of the selected memory page to the offset level information OL_INFO. In some embodiments, a mode signal may be determined based on the read offset level, and the mode signal may be transmitted with a read command to the memory device. A read voltage may be adjusted according to the read offset level, based on the mode signal.

The write operation manager 325 may include a timer 326 and a flag recorder 327.

When a selected memory page of a memory device undergoes a suspend operation while performing a program operation, the flag recorder 327 may transmit, to an internal memory of a memory controller, suspend flag information PSR_FLAG indicating that the selected memory page has undergone a suspend operation, such that the suspend flag information PSR_FLAG is stored in the internal memory.

In addition, the write operation manager 325 may transmit suspend operation information indicating various pieces of information regarding the suspend operation to the internal memory 340 of FIG. 2, such that the suspend operation information is stored in the internal memory 340 of FIG. 2. For example, the timer 326 may measure a resume time tRES by counting clock cycles of an internal clock or an external clock of the memory controller and transmit the measured resume time tRES to the internal memory of the memory controller, such that the measured resume time tRES is stored in the internal memory 340 of FIG. 2.

According to an exemplary embodiment of the inventive concept, the read operation manager 321 may determine a read offset level based on suspend operation information in a read operation on a memory page which has undergone a suspend operation, thereby increasing the reliability of the read operation of a memory device.

Figure 6:
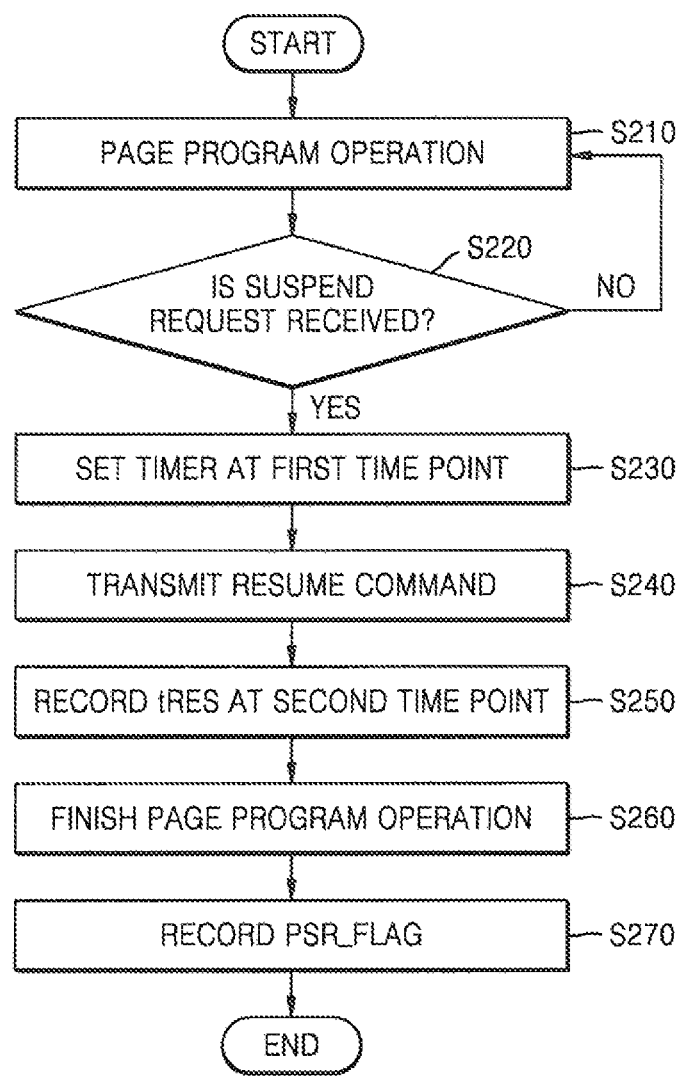
FIG. 6 is a flowchart of a program operation control method of a memory controller, according to example embodiments of the present inventive concept.

FIG. 6 is a flowchart of a program operation control method of a memory controller, according to some embodiments of the inventive concept. A description will be presented with reference to both FIGS. 6 and 1.

In operation S210, the memory device 400 may perform a program operation on a selected memory page connected to a selected word line among a plurality of memory pages.

In operation S220, the memory controller 300 may determine whether a suspend request indicating a request for a data operation with a higher priority is received from the host 100 while the memory device 400 is performing a program operation. While a suspend request is not received, the memory device 400 may keep performing the program operation in operation S210.

When the suspend request is received at operation S220, the memory controller 300 may set a timer at a first time point in operation S230. The first time point may be a time point where the memory controller 300 transmits a suspend command to the memory device 400. However, embodiments are not limited thereto, and the first time point may be a time point where the memory controller 300 transmits a data operation command with a higher priority to the memory device 400. The timer 326 in FIG. 5 may measure a time from the first time point by counting an internal clock or an external clock of the memory controller 300.

When the memory device 400 finishes a data operation with a higher priority, the memory controller 300 may transmit a resume command to the memory device 400 in operation S240. The memory device 400 may resume the suspended program operation in response to the reception of the resume command.

In operation S250, the memory controller 300 may record a resume time tRES at a second time point. The second time point may be a time point where the memory controller 300 transmits the resume command to the memory device 400. For example, the memory controller 300 may store, in the internal memory, the resume time tRES measured using the internal clock from the first time point to the second time point as a part of the suspend information.

After resuming the suspended program operation, the memory device 400 may finish the remaining program operation in operation S260.

In operation S270, the memory controller 300 may record suspend flag information PSR_FLAG indicating that the selected memory page has undergone a suspend operation. For example, the memory controller 300 may store the suspend flag information PSR_FLAG as a part of the suspend information in the internal memory. Unlike as shown in FIG. 6, the recording of the suspend flag information PSR_FLAG may be performed before the memory device 400 finishes a program operation after the memory controller 300 transmits a suspend command to the memory device 400. That is, the flowchart shown in FIG. 6 does not necessarily imply the sequential order thereof.

FIGS. 7A and 7B show tables illustrating suspend information PSR_INFO according to some embodiments of the inventive concept.

Referring to FIG. 7A, the suspend information PSR_INFO may include suspend flag information PSR_FLAG and suspend operation information corresponding to each memory page. The suspend operation information may include a resume time tRES. A memory page may be identified by an address of a word line connected to the memory page, and the suspend information PSR_INFO may include matching information of suspend flag information PSR_FLAG, which corresponds to an address ADDR, and a resume time tRES. For convenience of description, as a non-limiting example, it will be described that suspend flag information PSR_FLAG corresponding to a memory page which has undergone a suspend operation has a value of logic high ("1"), and suspend flag information PSR_FLAG corresponding to a memory page which has not undergone a suspend operation has a value of logic low ("0").

For example, when a memory page connected to a first address ADDR_1 has undergone a suspend operation for a first resume time tRES_1, suspend flag information PSR_FLAG corresponding to the first address ADDR_1 may have a value of logic high ("1"), and a resume time tRES corresponding to the first address ADDR_1 may be the first resume time tRES_1.

When a memory page connected to a third address ADDR_3 has not undergone a suspend operation, suspend flag information PSR_FLAG corresponding to the third address ADDR_3 may have a value of logic low ("0").

Suspend flag information PSR_FLAG and resume times tRES of a second address ADDR_2 and a kth address ADDR_k (k is a natural number) may also be stored as a part of the suspend information PSR_INFO in the same manner.

Referring to FIG. 7B, the suspend information PSR_INFO may include suspend flag information PSR_FLAG and suspend operation information for each memory page. The suspend operation information may include the number N_PSR of suspend operations, an accumulated resume time tRES_ACC indicating an accumulated time of program suspend sections by the suspend operation (i.e. accumulated suspension time), entry section information SECTION indicating an entry time point of a suspend operation in an ISPP operation, and a temperature TEMPERATURE in the suspend operation. A memory page may be identified by an address of a word line connected to the memory page, and the suspend information PSR_INFO may include matching information of suspend flag information PSR_FLAG corresponding to an address ADDR, the number N_PSR of suspend operations, an accumulated resume time tRES_ACC, entry section information SECTION, and a temperature TEMPERATURE.

For example, when a memory page connected to the first address ADDR_1 has undergone a first number (N_1) of suspend operations, an accumulated resume time tRES_ACC is a first accumulated resume time tRES_ACC_1, entry to a first section SEC_1 during an ISPP operation is performed, and a temperature TEMPERATURE at the entry is a first temperature TEMP_1, suspend flag information PSR_FLAG corresponding to the first address ADDR_1 may have a value of logic high ("1"), the number N_PSR of suspend operations corresponding to the first address ADDR_1 may have a value of the first number (N_1), an accumulated resume time tRES_ACC corresponding to the first address ADDR_1 may be the first accumulated resume time tRES_ACC_1, entry section information SECTION corresponding to the first address ADDR_1 may be the first section SEC_1, and a temperature TEMPERATURE corresponding to the first address ADDR_1 may be the first temperature TEMP_1.

As another example, when a memory page connected to the third address ADDR_3 has not undergone a suspend operation, suspend flag information PSR_FLAG corresponding to the third address ADDR_3 may have a value of logic low ("0").

Suspend flag information PSR_FLAG and resume times tRES of the second address ADDR_2 and the kth address ADDR_k (k is a natural number) may also be stored as a part of the suspend information PSR_INFO in a similar manner.

According to some embodiments with reference to FIGS. 7A and 7B, a memory controller may identify whether a memory page has undergone a suspend operation, based on suspend flag information PSR_FLAG included in suspend information PSR_INFO, and determine a read offset level based on suspend operation information included in the suspend information PSR_INFO.

Figure 8:
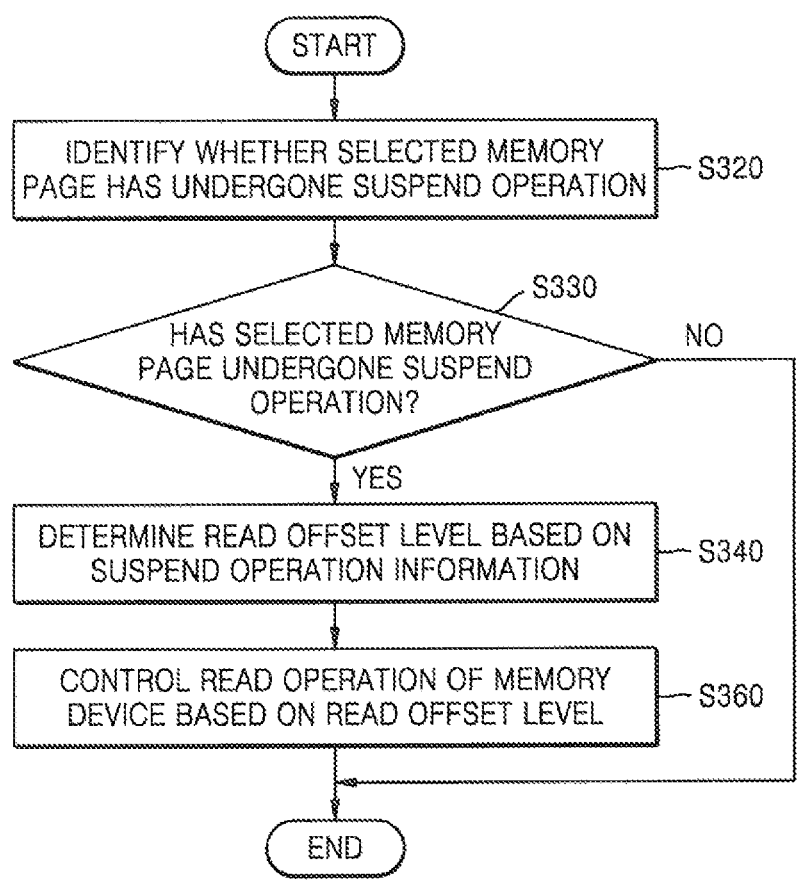
FIG. 8 is a flowchart of a read operation control method of a memory controller, according to example embodiments of the present inventive concept.

FIG. 8 is a flowchart of a read operation control method of a memory controller, according to an exemplary embodiment of the inventive concept. A description will be made with reference to both FIGS. 8 and 1. The memory device 400 may include a plurality of memory pages respectively connected to a plurality of word lines.

In operation S320, the memory controller 300 may identify whether a selected memory page connected to a selected word line among the plurality of memory pages has undergone a suspend operation. For example, the memory controller 300 may identify whether the selected memory page has undergone a suspend operation, based on suspend flag information included in stored suspend information PSR_INFO.

In operation S330, a next operation may be identified according to whether the selected memory page has undergone a suspend operation. When the selected memory page has not undergone a suspend operation in operation S330, the memory controller 300 may control the memory device 400 such that the memory device 400 performs a read operation without correcting a read voltage.

When the selected memory page has undergone a suspend operation in operation S330, the memory controller 300 may determine a read offset level of the selected memory page based on suspend operation information of the selected memory page in operation S340. For example, the suspend operation information may include a resume time. As another example, the memory controller 300 may determine a read offset level of a memory page by comparing offset level information, which is matching information of the read offset level corresponding to suspend operation information, to the suspend operation information of the memory page. Various embodiments related to offset level information will be described with reference to the drawings below.

In operation S360, the memory controller 300 may control a read operation of the memory device 400 based on the determined read offset level. For example, the memory controller 300 may transmit a read command to the memory device 400 based on the read offset level. An embodiment of transmitting a read command based on the determined read offset level will be described with reference to FIG. 11.

Figures 9, 10:
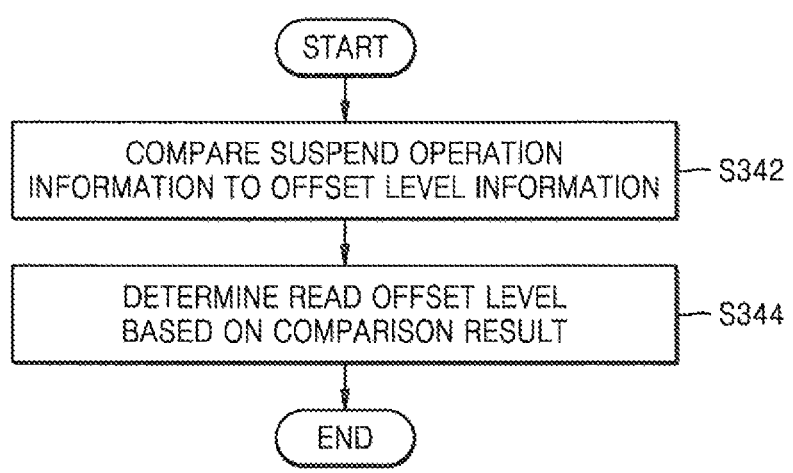
FIG. 9 shows a table illustrating offset level information according to example embodiments of the present inventive concept.
FIG. 10 is a flowchart of a read offset level determination method of a memory controller, according to example embodiments of the present inventive concept.

FIG. 9 shows a table illustrating offset level information OL_INFO according to some embodiments of the inventive concept. The offset level information OL_INFO may include matching information of a read offset level ROL corresponding to suspend operation information. The suspend operation information may include a resume time tRES. That is, the offset level information OL_INFO may include matching information of the read offset level ROL corresponding to the resume time tRES. The offset level information OL_INFO may be stored in a memory controller as information determined in advance. A change in a threshold voltage distribution of memory cells may vary according to the resume time tRES. Therefore, it may be needed that the read offset level ROL is controlled depending on the resume time tRES.

For example, when the resume time tRES is greater than or equal to 0 and less than a first reference time tREF_1, a corresponding read offset level ROL may be a first read offset level ROL_1. Likewise, when the resume time tRES is greater than or equal to a (k−1)th reference time tREF_k−1 and less than a kth reference time tREF_k, a corresponding read offset level ROL may be a kth read offset level ROL_k. When the resume time tRES is greater than or equal to the kth reference time tREF_k, the memory controller may control a memory device such that the memory device performs a read reclaim operation. The read reclaim operation may include an operation of moving a memory block including a selected memory page or partial data of the memory block to another memory block. In this case, the kth reference time tREF_k may be called a threshold time. That is, when the resume time tRES is greater than or equal to the threshold time, the memory controller may control the memory device such that the memory device performs a read reclaim operation.

The first read offset level ROL_1 to the kth read offset level ROL_k may have values different from each other, or some of the first read offset level RO_1 to the kth read offset level ROL_k may have the same value. In addition, as a non-limiting example, at least one of the first read offset level ROL_1 to the kth read offset level ROL_k may have a negative value, at least one thereof may have a positive value, and at least one thereof may have a value of "0".

FIG. 10 is a flowchart of a read offset level determination method of a memory controller, according to some embodiments of the inventive concept. A description will be made with reference to both FIGS. 10 and 1.

In operation S342, the memory controller 300 may compare suspend operation information of a selected memory page to be read and offset level information OL_INFO. For example, the offset level information OL_INFO may include matching information of a read offset level corresponding to the suspend operation information, and the suspend operation information of the selected memory page, which is included in suspend information PSR_INFO, may be compared with suspend operation information included in the offset level information OL_INFO.

In operation S344, the memory controller 300 may determine a read offset level based on a result of the comparison. For example, the memory controller 300 may determine the read offset level by searching for a read offset level corresponding to the suspend operation information of the selected memory page from the offset level information OL_INFO.

Figure 11:
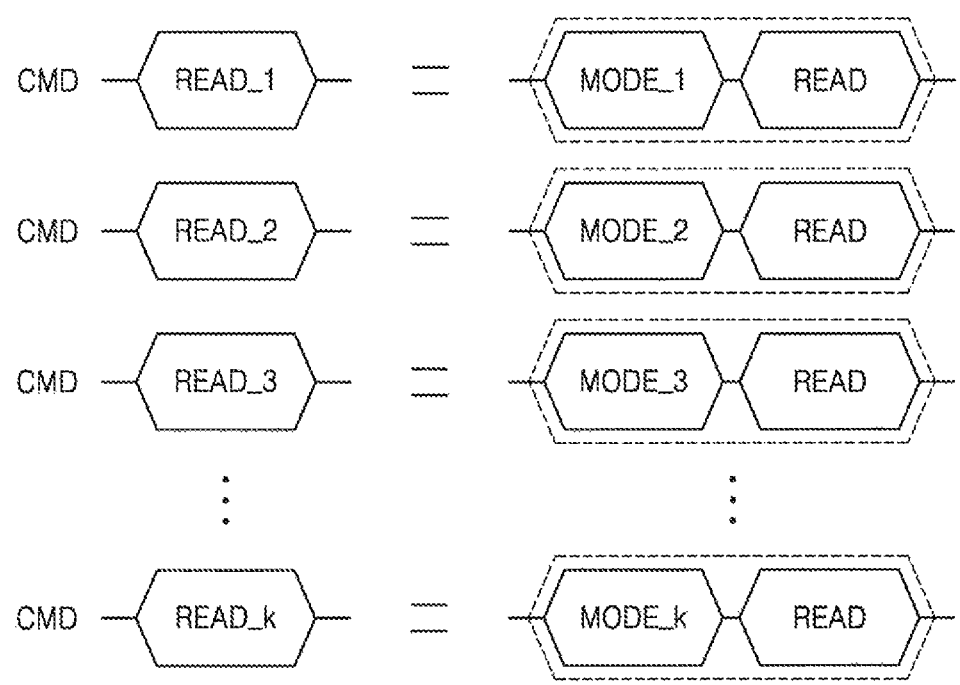
FIG. 11 illustrates command signals transmitted from a memory controller, according to example embodiments of the present inventive concept.

FIG. 11 illustrates command signals transmitted from a memory controller, according to some embodiments of the inventive concept. FIG. 11 will be described with reference to FIG. 9.

Referring to FIG. 9, the memory controller may control a read operation of a memory device based on a read offset level ROL corresponding to a resume time tRES of a selected memory page. The read offset level ROL may be one of the first read offset level ROL_1 to the kth read offset level ROL_k. To control a read operation of the memory device based on a different read offset level ROL, the memory controller may transmit a mode signal together when transmitting a read command to the memory device. Although FIG. 11 shows that a mode signal is included prior to a read command READ, but the present embodiment is not limited thereto. For example, a mode signal may be included before, after, overlapping, or in the middle of the read command READ.

For example, a mode in which the memory device performs a read operation based on the first read offset level ROL_1 may be called a first mode MODE_1. The memory controller may transmit, to the memory device, a first read command READ_1 including the read command and a mode signal indicating the first mode MODE_1. The memory device may correct a read voltage by the first read offset level ROL_1, based on the reception of the first read command READ_1. A second read command READ_2 to a kth read command READ k may also include a mode signal and the read command in the same manner.

Figure 12A:
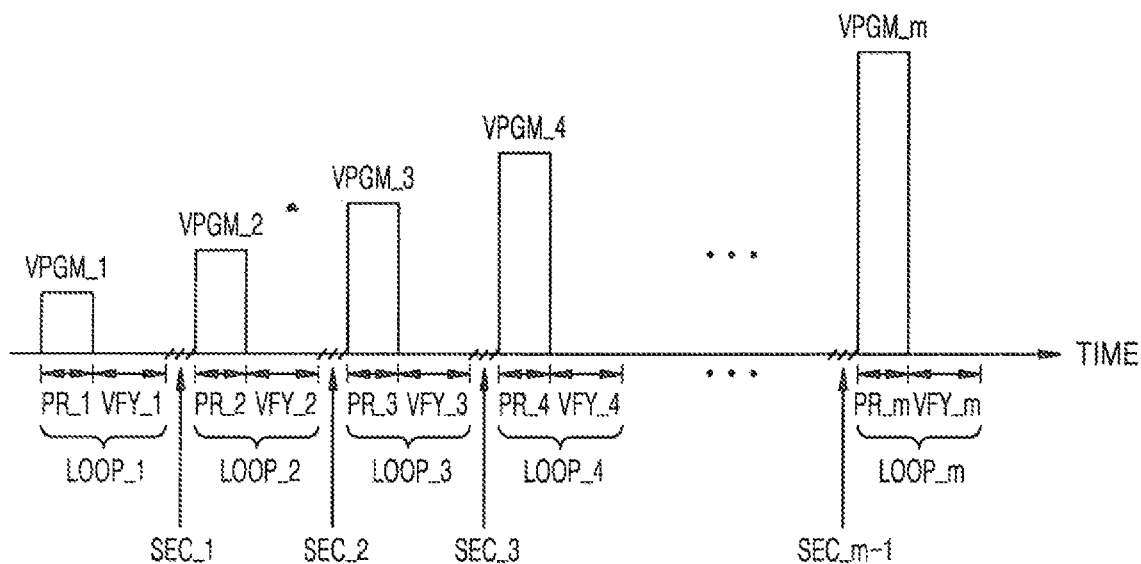
FIGS. 12A and 12B illustrate an incremental step pulse program (ISPP) operation and offset level information, according to example embodiments of the present inventive concept.
Figure 12B:
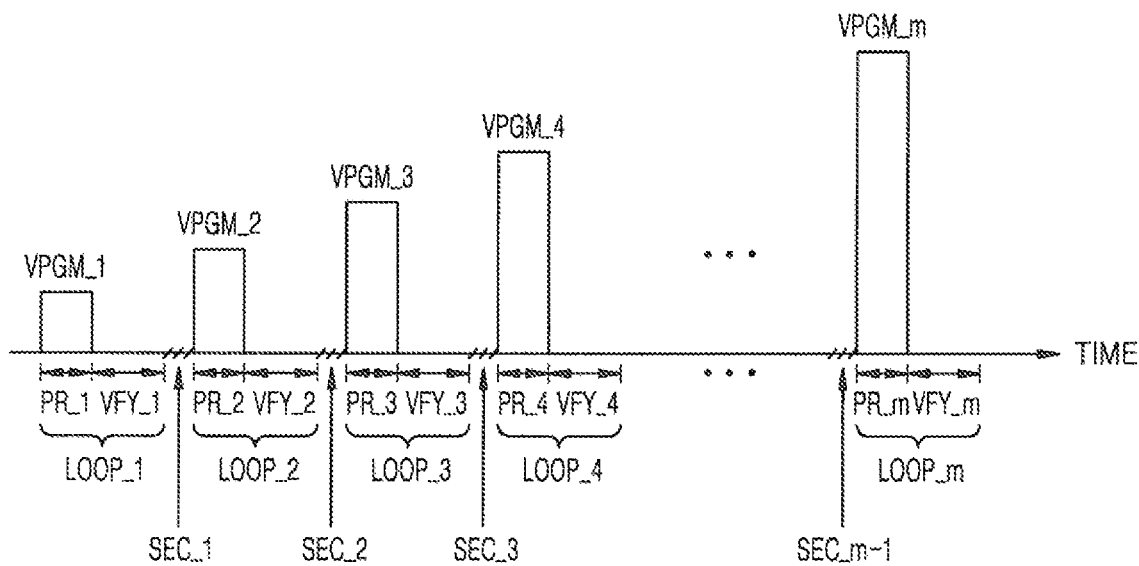

FIGS. 12A and 12B illustrate an ISPP operation and offset level information OL_INFO, according to an exemplary embodiment of the inventive concept.

The ISPP operation indicates a program operation of applying a gradually incremental magnitude of program voltage pulses to a word line. For example, the ISPP operation may include a plurality of loops (first to mth loops) LOOP_1 to LOOP_m. Each of the loops LOOP_1 to LOOP_m may include a program section and a verification section. For example, the first loop LOOP_1 may include a first program section PR_1 to be programmed at a first program voltage pulse VPGM_1, and a first verification section VFY_1, and the mth loop LOOP_m may include an mth program section PR_m to be programmed at an mth program voltage pulse VPGM_m, and an mth verification section VFY_m. A magnitude of a program voltage may increase toward the mth program voltage pulse VPGM_m from the first program voltage pulse VPGM_1.

A suspend operation may be performed in sections between the plurality of loops LOOP_1 to LOOP_m. For example, a section between the first loop LOOP_1 and the second loop LOOP_2 may be called a first entry section SEC_1, and when a memory device has undergone a suspend operation in the first entry section SEC_1, this may indicate that a suspend operation has started or entered from the first entry section SEC_1. When a suspend operation is performed during an ISPP operation, a change in a threshold voltage distribution of memory cells may vary according to an entry time point of a suspend operation. Therefore, it may be needed that a read offset level ROL is controlled differently according to an entry time point of a suspend operation.

Referring to FIG. 12A, suspend operation information may include entry section information SECTION indicating an entry time point of a suspend operation. That is, the offset level information OL_INFO may include matching information of the read offset level ROL according to the entry section information SECTION. The offset level information OL_INFO may be stored in a memory controller as information determined in advance.

For example, when the entry section information SECTION is the first entry section SEC_1, a corresponding read offset level ROL may be the first read offset level ROL_1. Likewise, when the entry section information SECTION is an (m−1)th entry section SEC_m−1, a corresponding read offset level ROL may be an (m−1)th read offset level ROL_m−1.

The first read offset level ROL_1 to the (m−1)th read offset level ROL_m−1 may have values different from each other, or some of the first read offset level ROL_1 to the (m−1)th read offset level ROL_m−1 may have the same value. In addition, as a non-limiting example, at least one of the first read offset level ROL_1 to the (m−1)th read offset level ROL_m−1 may have a negative value, at least one thereof may have a positive value, and at least one thereof may have a value of "0".

Referring to FIG. 12B, suspend operation information may include a resume time tRES and entry section information SECTION. The offset level information OL_INFO may include matching information of the resume time tRES and the read offset level ROL for each entry section information SECTION. The offset level information OL_INFO may be stored in a memory controller as information determined in advance.

The memory controller may determine the read offset level ROL by comparing entry section information SECTION and a resume time tRES of a selected memory page with the offset level information OL_INFO. For example, when the entry section information SECTION of the selected memory page is the first entry section SEC_1, and the resume time tRES is the (k−1)th reference time tREF_k−1 to the kth reference time tREF_k inclusive, the read offset level ROL may be determined as the kth read offset level ROL_k. As another example, when the entry section information SECTION of the selected memory page is the (m−1)th entry section SEC_m−1, and the resume time tRES is a first reference time tREF_1' to a second reference time tREF_2' inclusive, the read offset level ROL may be determined as a second read offset level ROL_2'. Reference times for respective pieces of entry section information SECTION may be different from each other, all the reference times may be same, or some of the reference times may be same.

FIG. 13 is a table illustrating offset level information OL_INFO according to some embodiments of the inventive concept. Suspend operation information may include the number N_PSR of suspend operations. That is, the offset level information OL_INFO may include matching information of a read offset level ROL according to the number N_PSR of suspend operations. The offset level information OL_INFO may be stored in a memory controller as information determined in advance.

For example, when the number N_PSR of suspend operations is greater than or equal to a first reference number NREF_1 and less than a second reference number NREF_2, a corresponding read offset level ROL may be a second read offset level ROL_2. When the number N_PSR of suspend operations is greater than or equal to an mth reference number NREF_m, the memory controller may control a memory device such that the memory device performs a read reclaim operation. In this case, the mth reference number NREF_m may be called a threshold number. That is, when the number N_PSR of suspend operations is greater than or equal to the threshold number, the memory controller may control the memory device such that the memory device performs a read reclaim operation.

The first read offset level ROL_1 to the mth read offset level ROL_m may have values different from each other, or some of the first read offset level ROL_1 to the mth read offset level ROL_m may have the same value. In addition, as a non-limiting example, at least one of the first read offset level ROL_1 to the mth read offset level ROL_m may have a negative value, at least one thereof may have a positive value, and at least one thereof may have a value of "0".

FIG. 14 is a table illustrating offset level information OL_INFO according to some embodiments of the inventive concept. Suspend operation information may include an accumulated resume time tRES_ACC. That is, the offset level information OL_INFO may include matching information of a read offset level ROL, according to the accumulated resume time tRES_ACC. The offset level information OL_INFO may be stored in a memory controller as information determined in advance.

For example, when the accumulated resume time tRES_ACC is greater than or equal to a second reference time tREF_2 and less than a third reference time tREF_3, a corresponding read offset level ROL may be a third read offset level ROL_3. When the accumulated resume time tRES_ACC is greater than or equal to an mth reference time tREF_m, the memory controller may control a memory device such that the memory device performs a read reclaim operation. In this case, the mth reference time tREF_m may be called a threshold time. That is, when the accumulated resume time tRES_ACC is greater than or equal to the threshold time, the memory controller may control the memory device such that the memory device performs a read reclaim operation.

The first read offset level ROL_1 to the mth read offset level ROL_m may have values different from each other, or some of the first read offset level ROL_1 to the mth read offset level ROL_m may have the same value. In addition, as a non-limiting example, at least one of the first read offset level ROL_1 to the mth read offset level ROL, m may have a negative value, at least one thereof may have a positive value, and at least one thereof may have a value of "0".

FIGS. 15A and 15B are tables illustrating offset level information OL_INFO according to some embodiments of the inventive concept. A change in a threshold voltage distribution of memory cells may vary according to a temperature TEMPERATURE at the time a suspend operation is performed. Therefore, it may be needed that a read offset level ROL is controlled differently according to a temperature TEMPERATURE at the time a suspend operation is performed.

Referring to FIG. 15A, suspend operation information may include a temperature TEMPERATURE at the time a suspend operation is performed. That is, the offset level information OL_INFO may include matching information of a read offset level ROL according to the temperature TEMPERATURE. The offset level information OL_INFO may be stored in a memory controller as information determined in advance.

For example, when the temperature TEMPERATURE is greater than or equal to a first reference temperature TEMP_REF_1 and less than a second reference temperature TEMP_REF_2, a corresponding read offset level ROL may be a second read offset level ROL_2. Likewise when the temperature TEMPERATURE is greater than or equal to an (m-1)th reference temperature TEMP_REF_m-1 and less than an mth reference temperature TEMP_REF_m, a corresponding read offset level ROL may be an mth read offset level ROL_m.

The first read offset level ROL_1 to the mth read offset level ROL_m may have values different from each other, or some of the first read offset level ROL_1 to the mth read offset level ROL_m may have the same value. In addition, as a non-limiting example, at least one of the first read offset level ROL_1 to the mth read offset level ROL_m may have a negative value, at least one thereof may have a positive value, and at least one thereof may have a value of "0".

Referring to FIG. 15B, suspend operation information may include a resume time tRES and a temperature TEMPERATURE. The offset level information OL_INFO may include matching information of the resume time tRES and a read offset level ROL for each temperature TEMPERATURE. The offset level information OL_INFO may be stored in a memory controller as information determined in advance.

In some embodiments, the temperature and the resume time may be used collectively to determine the read offset level. The memory controller may determine the read offset level ROL by comparing a temperature TEMPERATURE and a resume time tRES of a selected memory page with the offset level information OL_INFO. For example, when the temperature TEMPERATURE of the selected memory page in a suspend operation is greater than or equal to the first reference temperature TEMP_REF_1 and less than the second reference temperature TEMP_REF_2, and the resume time tRES is greater than or equal to the (k-1)th reference time tREF_k-1 and less than the kth reference time tREF_k, the read offset level ROL may be determined as the kth read offset level ROL_k. As another example, when the temperature TEMPERATURE of the selected memory page in a suspend operation is greater than or equal to an (m-1)th reference temperature TEMP_REF_m-1 and less than an mth reference temperature TEMP_REF_m, and the resume time tRES is the first reference time tREF_1' to the second reference time tREF_2' inclusive, the read offset level ROL may be determined as the second read offset level ROL_2'. Reference times for respective temperatures TEMPERATURE may be different from each other, all the reference times may be same, or some of the reference times may be same.

Figure 16:
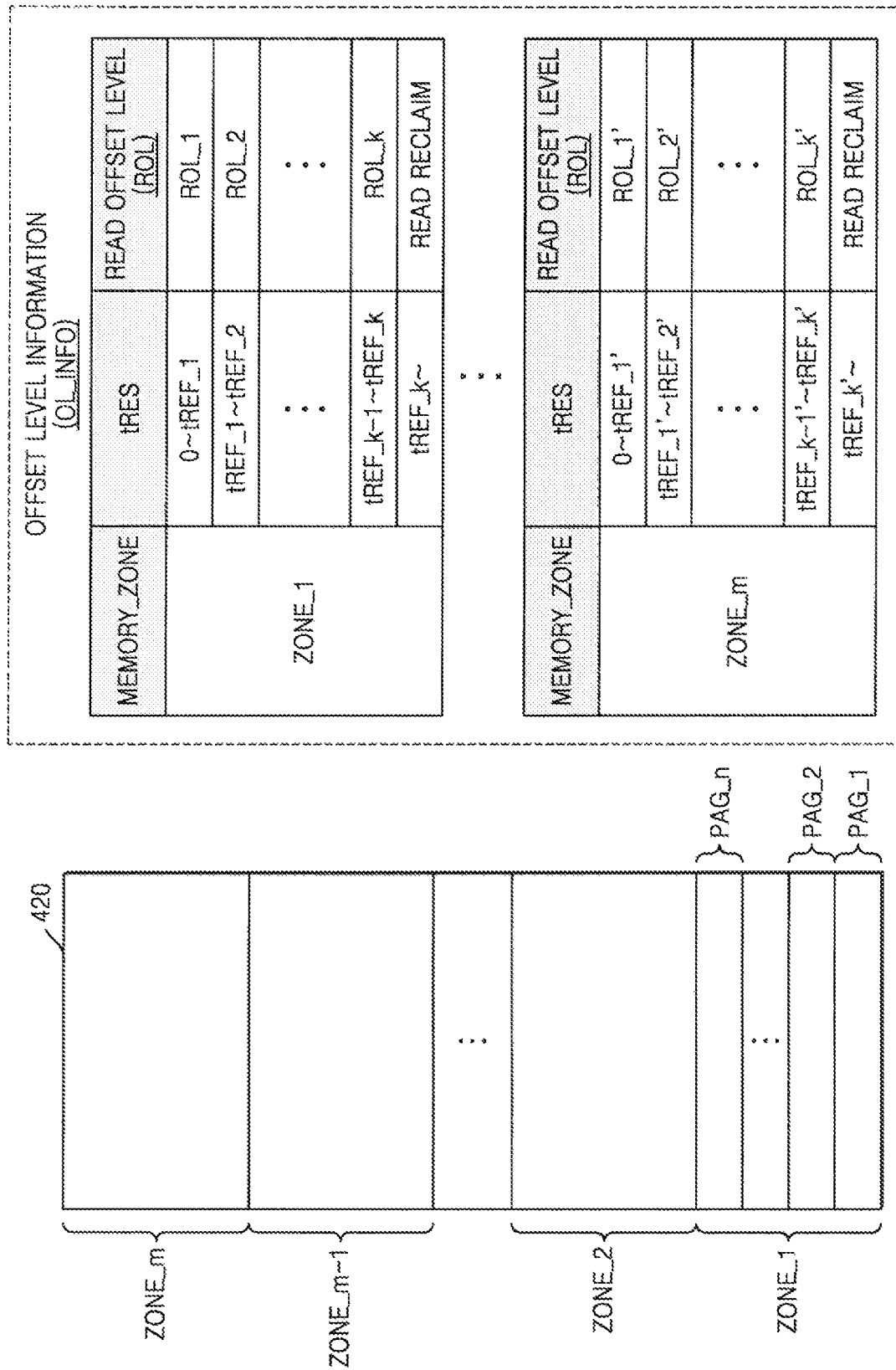
FIG. 16 illustrates a memory cell array and offset level information according to example embodiments of the present inventive concept.

FIG. 16 illustrates a memory cell array 420 and offset level information OL_INFO according to some embodiments of the inventive concept.

The memory cell array 420 may include a plurality of memory zones ZONE_1 to ZONE_m, and each of the plurality of memory zones ZONE_1 to ZONE_m may include a plurality of memory pages PAG_1 to PAG_n. A memory zone may be a memory block or a memory sub-block. However, the present embodiment is not limited thereto, and some of the memory zones ZONE_1 to ZONE_m may include different numbers of memory pages. When a suspend operation is performed, a change in a threshold voltage distribution of memory cells according to a resume time tRES may vary for each memory zone. Therefore, a read offset level ROL may be controlled selectively according to a memory zone.

Suspend operation information in the offset level information OL_INFO may include a resume time tRES. The offset level information OL_INFO may include matching information of the resume time tRES and the read offset level ROL for each memory zone MEMORY_ZONE. The offset level information OL_INFO may be stored in a memory controller as information determined in advance.

The memory controller may determine the read offset level ROL by comparing an included memory zone MEMORY_ZONE and a resume time tRES of a selected memory page with the offset level information OL_INFO. For example, when the memory zone MEMORY_ZONE of the selected memory page is a first zone ZONE_1, and the resume time tRES is greater than or equal to the (k-1)th reference time tREF_k-1 and less than the kth reference time tREF_k, the read offset level ROL may be determined as the kth read offset level ROL_k. As another example, when the memory zone MEMORY_ZONE of the selected memory page is an mth zone ZONE_m, and the resume time tRES is the first reference time tREF_1' to the second reference time tREF_2' inclusive, the read offset level ROL may be determined as the second read offset level ROL_2'. Reference times for respective memory zones MEMORY_ZONE may be different from each other, all the reference times may be same, or some of the reference times may be same.

FIG. 17 is tables illustrating offset level information OL_INFO according to some embodiments of the inventive concept.

Each of memory cells included in a memory cell array may store the least significant bit (LSB), a central significant bit (CSB), and the most significant bit (MSB). However, this example is for a 3-bit data configuration and the number of bits which each memory cell stores is not limited thereto. LSBs of memory cells connected to a word line may form an LSB page, CSBs thereof may form a CSB page, and MSBs thereof may form an MSB page. That is, a page type PAGE TYPE of a memory page may include an LSB page, a CSB page, and an MSB page. When a suspend operation is performed, a change in a threshold voltage distribution of memory cells according to a resume time tRES may vary for each memory page type. Therefore, it may be needed that a read offset level ROL may be controlled differently according to a memory page type.

The offset level information OL_INFO may include matching information of the read offset level ROL according to suspend operation information. The suspend operation information may include a resume time tRES. The offset level information OL_INFO may include matching information of the resume time tRES and the read offset level ROL for each page type PAGE TYPE. The offset level information OL_INFO may be stored in a memory controller as information determined in advance.

The memory controller may determine the read offset level ROL by comparing a page type PAGE TYPE and/or a resume time tRES of a selected memory page with the offset level information OL_INFO. For example, when the page type PAGE TYPE of the selected memory page is an LSB page, and the resume time tRES is greater than or equal to the (k−1)th reference time tREF_k−1 and less than the kth reference time tREF_k, the read offset level ROL may be determined as the kth read offset level ROL_k. As another example, when the page type PAGE TYPE of the selected memory page is an MSB page, and the resume time tRES is the first reference time tREF_1" to the second reference time tREF_2" inclusive, the read offset level ROL may be determined as the second read offset level ROL_2". Reference times for respective page types PAGE TYPE may be different from each other, the reference times may be same, or some of the reference times may be same.

FIG. 18 includes tables illustrating offset level information OL_INFO according to some embodiments of the inventive concept. When a suspend operation is performed, a change in a threshold voltage distribution of memory cells according to a resume time tRES may vary for each number of program and erase cycles of a memory page. Therefore, it may be needed that a read offset level ROL may be controlled differently according to the number of program and erase cycles of a memory page.

The offset level information OL_INFO may include matching information of the read offset level ROL according to suspend operation information. The suspend operation information may include a resume time tRES. The offset level information OL_INFO may include matching information of the resume time tRES and the read offset level ROL for the number of program and/or erase cycles. The offset level information OL_INFO may be stored in a memory controller as information determined in advance.

Figure 19:
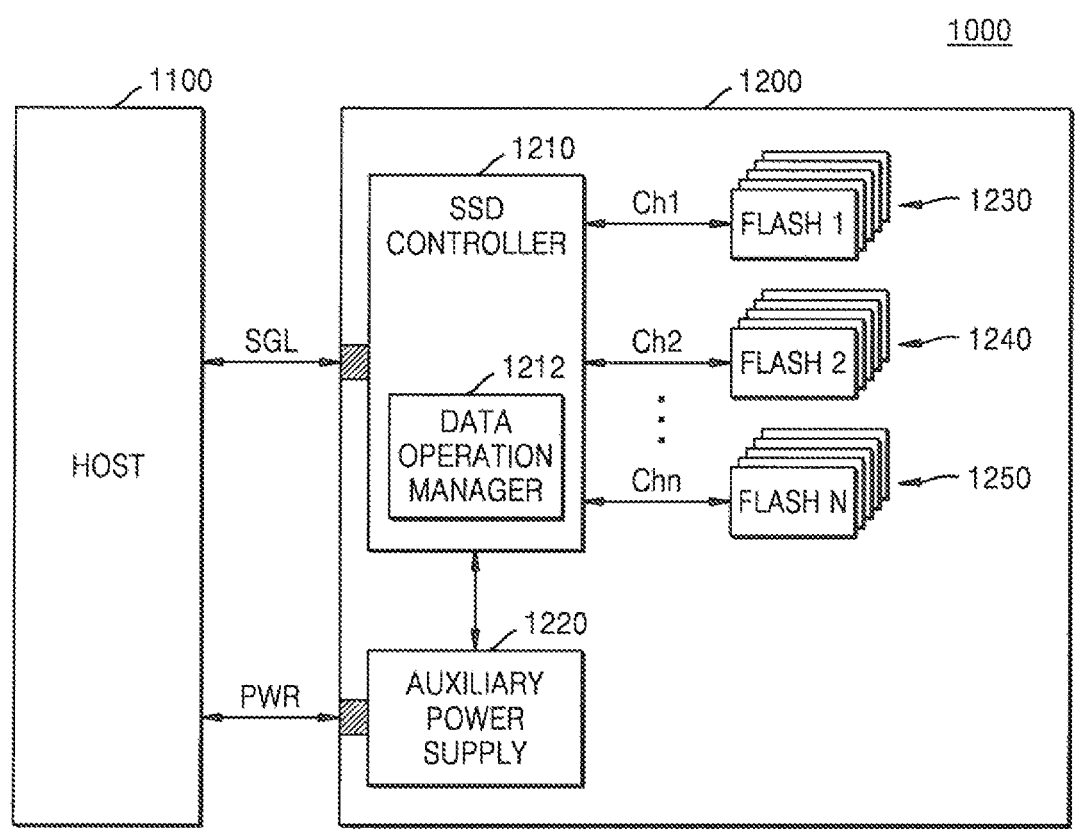
FIG. 19 is a block diagram of a solid state drive (SSD) system according to example embodiments of the present inventive concept.

The memory controller may determine the read offset level ROL by comparing the number of program and/or erase cycles and a resume time tRES of a selected memory page with the offset level information OL_INFO. For example, when the number of program and/or erase cycles of the selected memory page is 0 to the first reference number NREF_1 inclusive, and the resume time tRES is greater than or equal to the (k−1)th reference time tREF_k−1 and less than the kth reference time tREF_k, the read offset level ROL may be determined as the kth read offset level ROL_k. As another example, when the number of program and erase cycles of the selected memory page is greater than or equal to an (m−1)th reference number NREF_m−1 and less than an mth reference number NREF_m, and the resume time tRES is the first reference time tREF_1' to the second reference time tREF_2' inclusive, the read offset level ROL may be determined as the second read offset level ROL_2. Reference times for respective numbers of program and/or erase cycles may be different from each other, all the reference times may be same, or some of the reference times may be same FIG. 19 is a block diagram of a solid state drive (SSD) system 1000 according to some embodiments of the inventive concept.

The SSD system 1000 may include a host 1100 and an SSD 1200. The SSD 1200 may transmit and/or receive a signal to and/or from the host 1100 through a signal connector and receive power through a power connector. The SSD 1200 may include an SSD controller 1210, an auxiliary power supply 1220, and a plurality of memory devices 1230, 1240, and 1250. In this case, the SSD 1200 may be implemented using the embodiments described with reference to FIGS. 1 to 18.

In detail, according to the embodiments described with reference to FIGS. 1 to 18, the SSD controller 1210 may include a data operation manager 1212. The data operation manager 1212 may control a data operation of each of the plurality of memory devices 1230, 1240, and 1250. In a read operation control, the data operation manager 1212 of the SSD controller 1210 may identify whether a selected memory page to be read has undergone a suspend operation, and determine a read offset level based on suspend operation information and offset level information of the selected memory page. The SSD controller 1210 may control a read operation of the memory devices 1230, 1240, and 1250 based on the read offset level, thereby improving the reliability of the read operation.

As used herein, the term "and/or" includes any and all combinations of one or more of the associated listed items. Expressions such as "at least one of," when preceding a list of elements, modify the entire list of elements and do not modify the individual elements of the list.

As described above, the exemplary embodiments have been described with reference to the drawings and the specification. Although the embodiments have been described using specific terms in the specification, these terms are used to describe the technical idea of the present disclosure but are not used to limit the meaning or limit the scope of the present disclosure in the claims. While the inventive concept has been particularly shown and described with reference to embodiments thereof, it will be understood that various changes in form and details may be made therein without departing from the spirit and scope of the following claims.

What is claimed is:

1. A read control method of a memory controller for controlling a memory device comprising a plurality of memory pages respectively connected to a plurality of word lines, the read control method comprising:
   identifying a selected memory page of the plurality of memory pages connected to a selected word line among the plurality of word lines that has undergone a suspend operation;
   determining a read offset level of the selected memory page based on suspend operation information associated with the selected memory page according to a result of the identifying the selected memory page; and controlling a read operation of the memory device based on a read voltage associated with the read offset level that, was determined.

2. The read control method of claim 1, wherein the identifying the selected memory page that has undergone a suspend operation comprises:
identifying that the selected memory page has undergone a suspend operation based on suspend flag information corresponding to the selected memory page.

3. The read control method of claim 1, wherein the suspend operation information comprises a resume time indicating a time interval of a program suspend section during the suspend operation.

4. The read control method of claim 3, wherein the controlling the read operation comprises:
controlling the memory device to perform a read reclaim operation, responsive to the resume time of the selected memory page being a threshold time or longer.

5. The read control method of claim 1, wherein the determining of the read offset level comprises determining the read offset level of the selected memory page based on offset level information comprising matching information of the read offset level corresponding to the suspend operation information, and/or matching the suspend operation information corresponding to the selected memory page.

6. The read control method of claim 5,
wherein the suspend operation information of the selected memory page comprises entry section information indicating an entry time point of the suspend operation in an incremental step pulse program (ISPP) operation of the selected memory page, and
wherein the offset level information comprises matching information of a read offset level corresponding to the entry section information.

7. The read control method of claim 5, wherein the suspend operation information of the selected memory page comprises:
entry section information indicating an entry time point of the suspend operation in an incremental step pulse program (ISPP) operation of the selected memory page, and
a resume time indicating a time interval of an ISPP operation suspend section by the suspend operation, and
the offset level information comprising matching information of a read offset level corresponding to the resume time for the entry section information.

8. The read control method of claim 5,
wherein the suspend operation information of the selected memory page comprises a number of suspend operations of the selected memory page, and
wherein the offset level information comprises matching information of a read offset level corresponding to the number of suspend operations.

9. The read control method of claim 5,
wherein the suspend operation information of the selected memory page comprises an accumulated resume time indicating an accumulated time of program suspend sections by the suspend operation, and
wherein the offset level information comprises matching information of a read offset level corresponding to the accumulated resume time.

10. The read control method of claim 5,
wherein the suspend operation information of the selected memory page comprises a temperature of the memory device at a time the suspend operation is performed, and wherein the offset level information comprises matching information of a read offset level corresponding to the temperature of the memory device.

11. The read control method of claim 5,
wherein the memory device comprises a plurality of memory zones, each memory zone comprising at least one memory page,
wherein the suspend operation information of the selected memory page comprises:
a selected memory zone to which the selected memory page belongs among the plurality of memory zones, and
a resume time indicating a time interval of a program operation suspend section by the suspend operation, and
wherein the offset level information comprises matching information of a read offset level corresponding to the resume time for the selected memory zone.

12. The read control method of claim 5,
wherein the suspend operation information of the selected memory page comprises a resume time indicating a time interval of a program operation suspend section by the suspend operation,
wherein the offset level information comprises matching information of a read offset level corresponding to the resume time for each page type, and
wherein the determining of the read offset level comprises determining the read offset level by comparing the resume time of the selected memory page to the offset level information based on a page type of the selected memory page.

13. The read control method of claim 5,
wherein the suspend operation information of the selected memory page comprises a resume time indicating a time interval of a program operation suspend section by the suspend operation,
wherein the offset level information comprises matching information of a read offset level corresponding to the resume time for a number of program and erase cycles, and
wherein the determining of the read offset level comprises determining the read offset level by comparing the resume time of the selected memory page to the offset level information based on the number of program and erase cycles of the selected memory page.

14. The read control method of claim 1, wherein the controlling the read operation comprises:
determining a mode signal based on the read offset level, and
transmitting the mode signal together with a read command to the memory device,
wherein the read voltage is adjusted according to the read offset level, based on the mode signal.

15. A program control method of a memory controller for controlling a memory device comprising a plurality of memory pages respectively connected to a plurality of word lines, the program control method comprising:
receiving a request for a data operation with a higher priority from an external host during a program operation on a selected memory page of the plurality of memory pages connected to a selected word line of the plurality of word lines of the memory device;
transmitting a suspend command to the memory device, responsive to the receiving the request for the data operation with the higher priority;

receiving, from the memory device, a signal indicating that the program operation has been suspended, responsive to the transmitting the suspend command;

transmitting, to the memory device, a command corresponding to the request for the data operation with the higher priority;

transmitting a resume command to the memory device such that the memory device resumes the program operation after completion of the data operation with the higher priority; and storing suspend flag information indicating that the selected memory page has undergone a suspend operation and suspend operation information of the selected memory page, wherein the suspend operation information of the selected memory page is used to determine a read offset level when a read operation on the selected memory page is performed.

16. The program control method of claim 15, wherein the suspend operation information of the selected memory page comprises a resume time, and wherein the resume time indicates a time interval from a first time point where the suspend command was transmitted to the memory device to a second time point where the resume command was transmitted to the memory device, or indicates a time interval from a third time point where the command corresponding to the receiving the request for the data operation with the higher priority to the second time point where the resume command was transmitted to the memory device.

17. The program control method of claim 15, wherein the suspend operation information of the selected memory page comprises at least one of a resume time indicating a time interval of a program suspend section by a suspend operation, a number of suspend operations of the selected memory page, an accumulated resume time indicating an accumulated time of program suspend sections by the suspend operation, or a temperature of the memory device when the suspend operation is performed.

18. A memory controller for controlling a memory device comprising a plurality of memory pages respectively connected to a plurality of word lines, the memory controller comprising:

a processor; and an internal memory configured to store suspend flag information that indicates whether a suspend operation has been performed, suspend operation information for each memory page of the plurality of memory pages, and matching information of a read offset level corresponding to the suspend operation information, wherein the processor is configured to control the memory controller to transmit a read command signal to the memory device based on the suspend operation information and the read offset level of a selected memory page connected to a selected word line of the plurality of word lines, responsive to identifying that the selected memory page has undergone a suspend operation based on the suspend flag information of the selected memory page, and responsive to a read request received from an external host for the memory controller, and wherein the suspend operation information and the read offset level are stored in the internal memory.

19. The memory controller of claim 18, wherein the suspend operation information of the selected memory page comprises a resume time indicating a time interval of a program suspend section by the suspend operation.

\* \* \* \* \*